United States Patent
Chen et al.

(10) Patent No.: US 12,009,211 B2
(45) Date of Patent: Jun. 11, 2024

(54) METHOD FOR HIGHLY ANISOTROPIC ETCHING OF TITANIUM OXIDE SPACER USING SELECTIVE TOP-DEPOSITION

(71) Applicant: Tokyo Electron Limited, Tokyo (JP)

(72) Inventors: Ya-Ming Chen, Albany, NY (US); Katie Lutker-Lee, Albany, NY (US); Eric Chih-Fang Liu, Albany, NY (US); Angelique Raley, Albany, NY (US); Stephanie Oyola-Reynoso, Albany, NY (US); Shihsheng Chang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 405 days.

(21) Appl. No.: 17/525,860

(22) Filed: Nov. 12, 2021

(65) Prior Publication Data

US 2023/0154752 A1  May 18, 2023

(51) Int. Cl.
- *H01L 21/033* (2006.01)
- *H01J 37/32* (2006.01)
- *H01L 21/311* (2006.01)

(52) U.S. Cl.
CPC .... *H01L 21/0337* (2013.01); *H01L 21/31122* (2013.01); *H01J 37/3211* (2013.01); *H01J 2237/3341* (2013.01)

(58) Field of Classification Search
CPC ................................................. H01L 21/033
See application file for complete search history.

(56) References Cited

U.S. PATENT DOCUMENTS

| | | | |
|---|---|---|---|
| 8,906,760 B2 | 12/2014 | Ranjan et al. | |
| 9,576,817 B1 | 2/2017 | Cheng et al. | |
| 9,721,807 B2 | 8/2017 | Zhou et al. | |
| 10,546,748 B2 | 1/2020 | Yu et al. | |
| 2012/0220132 A1* | 8/2012 | Oyama | H01L 21/31138 257/E21.258 |
| 2015/0206764 A1* | 7/2015 | Wang | H01L 21/0337 438/710 |
| 2016/0300718 A1* | 10/2016 | Raley | H01L 21/0273 |
| 2018/0240667 A1* | 8/2018 | Yu | H01L 21/0274 |
| 2019/0237341 A1* | 8/2019 | Yu | H01L 21/67259 |
| 2020/0083044 A1 | 3/2020 | Yu et al. | |

* cited by examiner

*Primary Examiner* — William A Harriston
(74) *Attorney, Agent, or Firm* — Egan, Enders & Huston LLP

(57) ABSTRACT

Methods are provided herein for forming spacers on a patterned substrate. A self-aligned multiple patterning (SAMP) process is utilized for patterning structures, spacers formed adjacent mandrels, on a substrate. In one embodiment, a novel approach of etching titanium oxide ($TiO_2$) spacers is provided. Highly anisotropic etching of the spacer along with a selective top deposition is provided. In one embodiment, an inductively coupled plasma (ICP) etch tool is utilized. The etching process may be achieved as a one-step etching process. More particularly, a protective layer may be selectively formed on the top of the spacer to protect the mandrel as well as minimize the difference of the etching rates of the spacer top and the spacer bottom. In one embodiment, the techniques may be utilized to etch $TiO_2$ spacers formed along amorphous silicon mandrels using an ICP etch tool utilizing a one-step etch process.

20 Claims, 6 Drawing Sheets

METHOD FOR HIGHLY ANISOTROPIC ETCHING OF TITANIUM OXIDE SPACER USING SELECTIVE TOP-DEPOSITION

BACKGROUND

The present disclosure relates to the processing of substrates. In particular, it provides a novel method for forming multiple patterning structures during the processing of substrates.

As geometries in substrate processing continue to shrink, the technical challenges to forming structures on substrates via photolithography techniques increase. As requirements for smaller geometry structures arose, a variety of photolithography techniques have been utilized for achieving suitable photolithography for such structures, including extreme ultraviolet (EUV) lithography, multiple patterning schemes (including self-aligned multiple patterning (SAMP) schemes such as, for example, self-aligned double patterning (SADP), self-aligned triple patterning (SATP), self-aligned quadruple patterning (SAQP), self-aligned octuple patterning (SAOP), etc.), or other small geometry patterning methods. Conventional SAMP processes may superimpose two or more multi-color pattern arrays to form the various designed structures on a substrate by selectively cutting overlapping portions of materials.

As known in the art, SAMP processes may utilize a mandrel (or core or backbone) structure having spacers formed on the sides of the mandrel to increase the structure density of the substrate surface. For example, in SADP, a mandrel may be formed on the substrate through known photolithography techniques. Mandrels may be formed of a wide variety of materials, including but not limited to, silicon, silicon nitride, hard mask materials, spin on carbon (SOC), photoresist, silicon oxide, etc. Sidewall spacers may then be formed adjacent to the mandrel. The spacers may be formed from any of a wide variety of materials (such as, for example, oxides, nitrides, titanium oxide, titanium nitride etc.) through use of a conformal deposition process (including but not limited to atomic layer deposition (ALD) techniques, chemical vapor deposition (CVD) techniques, etc.) and subsequent spacer etch. At some point, a mandrel pull step may be performed to remove the originally patterned mandrel, leaving the two sidewall spacers, thus forming two structures for each mandrel.

As line pitches go below 40 nm, the etching of the spacer has become increasingly difficult. For example, as pitches decrease, the ability to achieve bottom separation of the spacers formed along the mandrels has become more difficult. Efforts to achieve adequate bottom separation often result in significant spacer sidewall loss and damage to the mandrel during the spacer etch. In one example, titanium oxide spacers formed along amorphous silicon mandrels are etched in capacitively coupled (CCP) plasma etch tools. Narrow pitches (such as below 40 nm) obtaining desirable bottom separation of the spacer may result in significant sidewall loss and damage to the mandrel.

It would be desirable to provide an improved technique for forming spacers adjacent mandrels for narrow pitch structures.

SUMMARY

Improved process flows and methods are provided herein for forming spacers on a patterned substrate. In the disclosed process flows and methods, a self-aligned multiple patterning (SAMP) process is utilized for patterning structures, spacers formed adjacent mandrels, on a substrate. In one embodiment, a novel approach of etching titanium oxide ($TiO_2$) spacers is provided. Highly anisotropic etching of the spacer along with a selective top deposition is provided. In one embodiment, an inductively coupled plasma (ICP) etch tool is utilized. The etching process may be achieved as a one-step etching process. More particularly, a protective layer may be selectively formed on the top of the mandrel/spacer structure to protect the mandrel as well as minimize the difference of the etching rates of the spacer top and the spacer bottom. In one embodiment, the techniques may be utilized to etch $TiO_2$ spacers formed along amorphous silicon mandrels using an ICP etch tool utilizing a one-step etch process.

In a first embodiment, a method of forming spacers on a substrate for use in a self-aligned multiple patterning process (SAMP) is provided. The method comprises forming a plurality of structures on the substrate, the plurality of structures comprising at least mandrels, the mandrels being used as part of the SAMP process; forming a spacer layer over the mandrels; and providing an inductively coupled plasma apparatus. The method further comprises generating a one-step plasma in the inductively coupled plasma apparatus, the one-step plasma formed in a presence of a reactive etching gas and a passivating agent gas. The method also comprises utilizing the one-step plasma to etch the spacer layer with a reactive etching species with to form the spacers on sidewalls of the mandrels; and utilizing the one-step plasma to forming a protective layer on tops of the mandrels, the protective layer lessening the etch of the mandrels when the spacers are formed with the one-step plasma.

In a second embodiment, a method of forming titanium oxide spacers on a substrate is provided. The method comprises forming a plurality of structures on the substrate, the plurality of structures comprising at least mandrels, the mandrels being formed to have a pitch of 40 nm or less; forming a titanium oxide spacer layer over the mandrels; providing an inductively coupled plasma apparatus; and generating a plasma in the inductively coupled plasma apparatus, the plasma formed in a presence of a reactive etching gas and a passivating agent gas. The method further comprises utilizing the plasma to etch the titanium oxide spacer layer with a reactive etching species with to form the titanium oxide spacers on sidewalls of the mandrels; and utilizing the plasma to forming a protective layer on tops of the mandrels, the protective layer providing at least some protection to the mandrels while the titanium oxide spacer layer is being etched to form the spacers.

In various alternatives of the described embodiments, the spacer layer may comprise titanium oxide and the mandrels may comprise amorphous silicon. In some alternatives, the reactive etching gas comprises chlorine. In some alternatives, and the passivating agent gas comprises methane. In some alternatives, the one-step plasma is formed in a presence of carbon tetrafluoride (CF4) and/or nitrogen trifluoride. In some alternatives the mandrels have a pitch of 40 nm or less. In some alternatives, the mandrels are utilized as part of a self-aligned multiple patterning process.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 1A-1D illustrate forming mandrels and spacers for use in a self-aligned multiple patterning process.

DETAILED DESCRIPTION

Figure 1A:
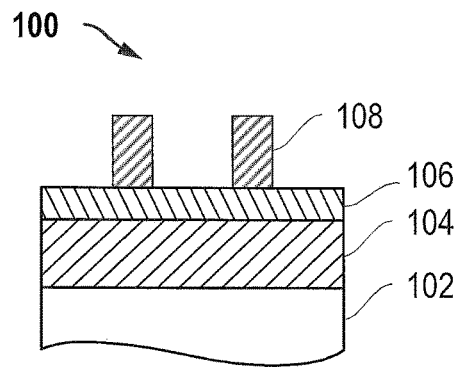

Improved process flows and methods are provided herein for forming spacers on a patterned substrate. In the disclosed process flows and methods, a self-aligned multiple patterning (SAMP) process is utilized for patterning structures, spacers formed adjacent mandrels, on a substrate. In one embodiment, a novel approach of etching titanium oxide ($TiO_2$) spacers is provided. Highly anisotropic etching of the spacer along with a selective top deposition is provided. In one embodiment, an inductively coupled plasma (ICP) etch tool is utilized. The etching process may be achieved as a one-step etching process. More particularly, a protective layer may be selectively formed on the top of the mandrel/spacer structure to protect the mandrel as well as minimize the difference of the etching rates of the spacer top and the spacer bottom. In one embodiment, the techniques may be utilized to etch $TiO_2$ spacers formed along amorphous silicon mandrels using an ICP etch tool utilizing a one-step etch process.

FIGS. 1A-1D illustrates a general SAMP spacer/mandrel process flow to which the techniques described herein may be applied. It will be recognized that the embodiment and structures of FIGS. 1A-1D are merely exemplary and the techniques described herein may be applied to other process flows. In the embodiment shown in FIG. 1A, the structures formed on the patterned substrate 100 include at least a plurality of mandrels 108. The mandrels 108 may generally be formed over one or more underlying layers, such as a hard mask layer 106, an etch stop layer 104, and a substrate 102. The underlying layers described, however, are merely exemplary; more, less or other underlying layers may be utilized.

Substrate 102 may be any substrate for which the use of patterned features is desirable. For example, in one embodiment, substrate 102 may be a semiconductor substrate having one or more semiconductor processing layers formed thereon. In one embodiment, the substrate 102 may be a substrate that has been subject to multiple semiconductor processing steps which yield a wide variety of structures and layers, all of which are known in the substrate processing art.

The hard mask layer 106 and etch stop layer 104 may be formed of any of a wide variety of materials as is known in the art. Likewise, the mandrels 108 may be formed from a wide variety of materials. In one embodiment, mandrels 108 may be formed of amorphous silicon. Mandrels 108 may be formed of a wide variety of other materials, though, including but not limited to silicon nitride, hard mask materials, spin on carbon (SOC) or other organic layers, photoresist, silicon oxide, etc.

The techniques for forming mandrels 108 in a multiple patterning process are well known in the art. As known, mandrels 108 may be patterned by any of a number of photolithography or other patterning techniques. In one embodiment, mandrels 108 may be formed through a process that utilizes photolithography techniques to pattern a resist layer over a mandrel layer. A variety of photolithography techniques may be utilized to pattern the mandrel layer to form mandrels 108. Examples of photolithography techniques that may be used to form mandrels 108 include, but are not limited to, 193/193i lithography, EUV lithography, a combination of lithography and etch steps, etc. In some embodiments, one or more intervening layers may be used as part of the photolithography process between the mandrel layer and the resist layer, including one or more spin on glass (SOG) layers, spin on carbon (SOC) layers, antireflective coatings, etc., all as is known in the art. After patterning the mandrel layer, the mandrels 108 remain as shown in FIG. 1A. It will be recognized that the concepts disclosed herein are not limited, however, to any particular mandrel formation technique and are applicable to any techniques utilized to form the mandrels 108.

Figure 1B:
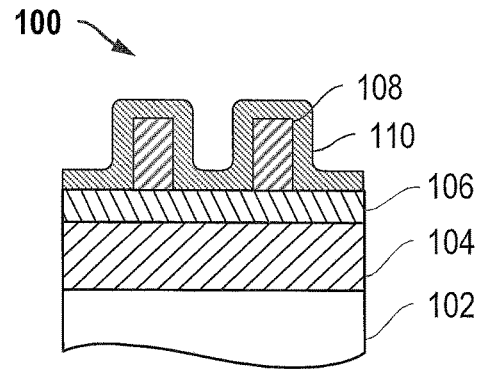

After the formation of the mandrels 108, a spacer layer 110 may be formed on the mandrels 108 as shown in FIG. 1B. In one embodiment, the spacer layer 110 may generally be formed through the use of an atomic layer deposition (ALD) process. However, any of a wide variety of spacer formation techniques may be utilized and the spacers described herein are not limited to those formed by ALD techniques. In one embodiment, the spacer may be formed of $TiO_2$. Other spacer materials may also be utilized.

Figure 1C:
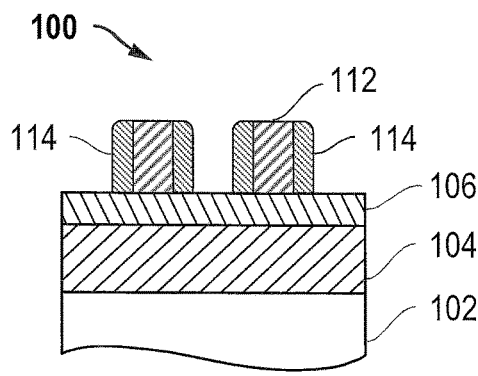

In FIG. 1C, the spacer layer 110 is etched to leave sidewall spacers 114 on either side of the trimmed mandrels 112. The sidewall spacers 114 may be formed using any of a wide variety of etch techniques, including but not limited to, plasma etch chemistries. The plasma etch chemistries used to etch the spacer layer 110 and form sidewall spacers 114 may generally depend on the spacer layer 110 material formed or deposited onto the patterned substrate 100 during the spacer formation step (shown in FIG. 1B). In some embodiments, the spacer layer 110 material may comprise silicon dioxide, silicon nitride, titanium oxide, or titanium nitride, for example. In such embodiments, plasma etch chemistries suitable for etching the spacer layer 110 and forming the sidewall spacers 114 may include, but are not limited to, $Cl_2$, $BCl_3$, $NF_3$, $CF_xH_y$, $SF_6$, $C_xF_y$, $O_2$, $N_2$, Ar, He, etc. Other plasma etch chemistries may be used to etch other spacer layer materials, as is known in the art. As described in the background above, using conventional spacer etch techniques the etching of the spacer has become increasingly difficult as pitches narrow. For example, as pitches decrease, the ability to achieve bottom separation of the spacers formed along the mandrels has become more difficult. Efforts to achieve adequate bottom separation often result in significant spacer sidewall loss and damage to the mandrel during the spacer etch. The disclosed achieve techniques described in more detail below provide for bottom separation without significant spacer sidewall loss and damage to the mandrel during the spacer etch.

Figure 1D:
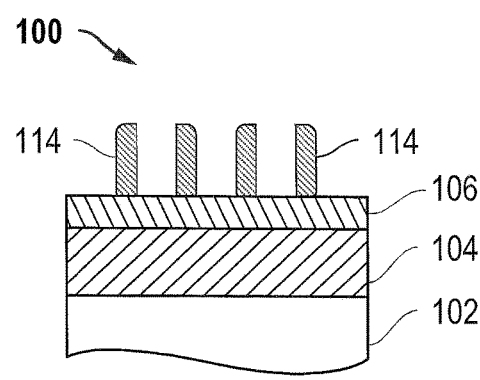

In FIG. 1D, the trimmed mandrels 112 are removed via another etch process commonly referred to as a mandrel pull step. In the mandrel pull step shown in FIG. 1D, the trimmed mandrels 112 are removed, leaving two sidewall spacers 114 on the patterned substrate 100 for each mandrel. The trimmed mandrels 112 may be removed using any of a wide variety of etch techniques, including but not limited to, plasma etch wet etch, and ash techniques. The mandrel pull step (shown in FIG. 1D) may be performed in the same or different chamber as the spacer etch step (shown in FIG. 1C). In some embodiments, the etch process used to remove the trimmed mandrels 112 may preferably demonstrate selectivity between the material of the sidewall spacers 114 (e.g., silicon oxide, silicon nitride, titanium oxide, or titanium nitride) and the material used to form the mandrels 108.

In some embodiments, one or more downstream processing steps may be performed after the mandrel pull step shown in FIG. 1D. For example, the pattern formed by the sidewall spacers 114 may be transferred to the hard mask layer 106 by subjecting the patterned substrate 100 to another etch process, which etches the hard mask layer 106 selectively to the sidewall spacers 114. The sidewall spacers 114 may then be removed via another etch or strip step to leave patterned hard mask structures (not shown) on the substrate 102.

The process flow shown in FIGS. 1A-1D is one example of a SAMP process that the etch techniques described in more detail below may be applied to. Although described above in the context of a SADP process flow, the etch techniques described herein may be utilized in a variety of SAMP process flows including SADP, SAQP, SAOP, etc. process flows.

In the process flow shown in FIGS. 1A-1D, a mandrel material and a spacer material are formed on a variety of underlying layers and materials, such as but not limited to, a hard mask layer 106, an etch stop layer 104, and a substrate 102. The hard mask layer 106, etch stop layer 104 and substrate 102 may be formed of any of a wide variety of materials as is known in the art. It will be recognized by those skilled in the art that the particular materials used and described in the figures are merely exemplary, and a wide range of materials may be utilized depending upon the particular process flow for which the etch techniques disclosed herein are being utilized.

Figure 2A:
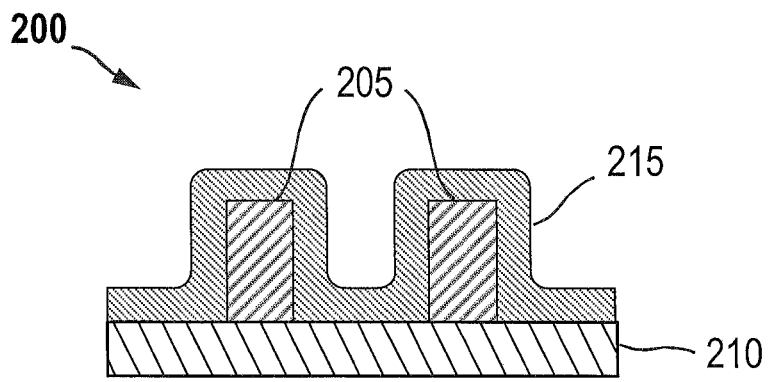
FIGS. 2A-2C illustrate an exemplary embodiment of a one-step spacer etch according to the techniques described herein.
Figure 2B:
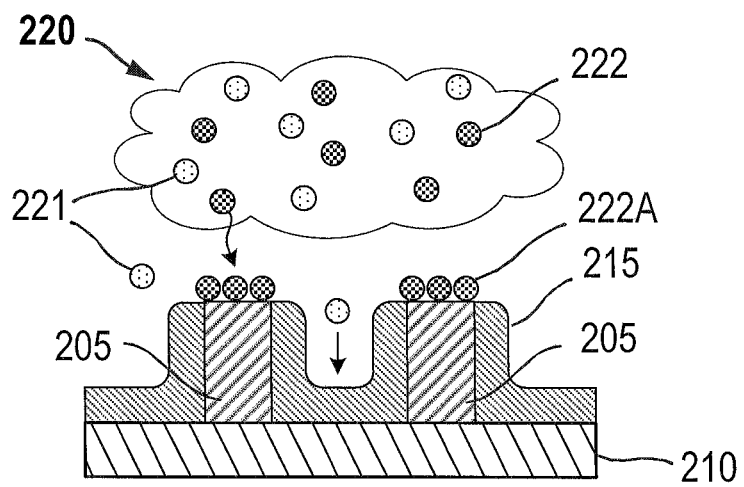
Figure 2C:
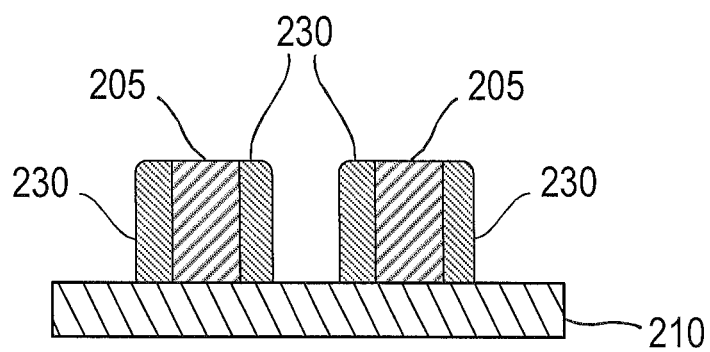

FIGS. 2A-2C illustrate a spacer etch technique for use in a SAMP process, for example, the process flow shown in FIGS. 1A-1D. It will be recognized that the spacer etch technique of FIGS. 2A-2C may be utilized with other process flows. As shown in FIG. 2A, a substrate 200 is provided with mandrels 205 formed on an underlying layer 210. A spacer layer 215 is then formed over the mandrels 205. Next, the substrate 200 is subjected to a plasma 220. The plasma 220 contains both a reactive etching species 221 and a passivating agent 222. As shown in FIG. 2B, the plasma 220 has partially etched the spacer layer 215 to expose the tops of the mandrels 205. When the tops of the mandrels 205 are exposed, the passivating agent 222 of the plasma 220 forms a protective layer 222A on at least the tops of the mandrels as shown in FIG. 2B. The protective layer 222A may also form on the tops of the spacer layer. As the substrate is continued to be exposed to the plasma 220, the process continues to etch the bottom areas of the spacer layer 215. The etching is continued until the bottom areas of the spacer layer 215 are cleared leaving spacers 230 formed on the sidewalls of the mandrels 205. In this manner, a highly anisotropic etching of the spacer along with a selective top deposition is provided. The etching process may be achieved as a one-step etching process that contains both an etching species and a passivation agent. The protective layer may be selectively formed on the top of the mandrel/spacer structure to protect the mandrel as well as minimize the difference of the etching rates of the spacer top and the spacer bottom. Thus, the disadvantages of prior art techniques which provide undesirable etching of the mandrel and excessive etching of the tops of the spacers may be overcome.

Figure 3A:
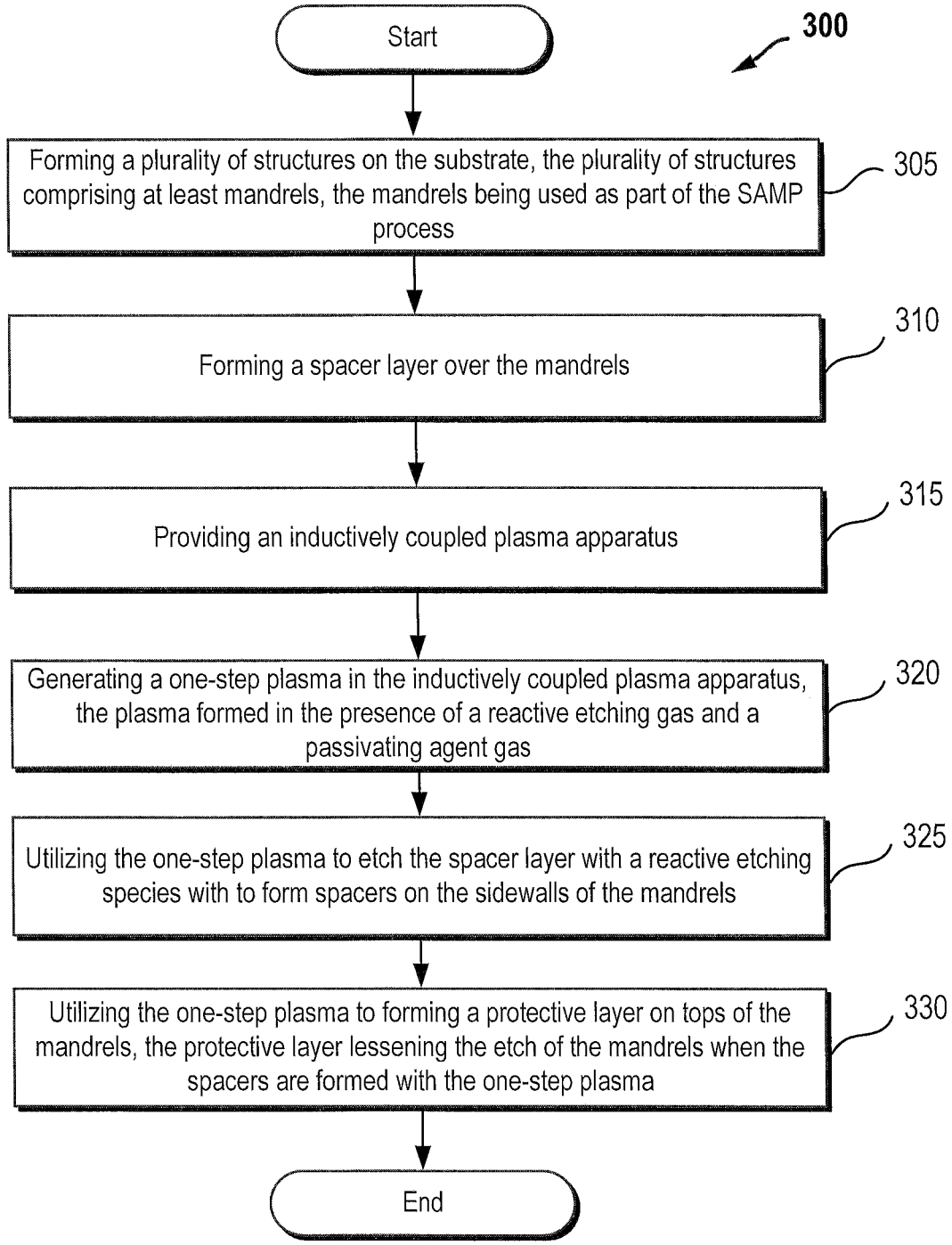
FIGS. 3A-3B illustrate exemplary methods of utilizing the techniques described herein.
Figure 3B:
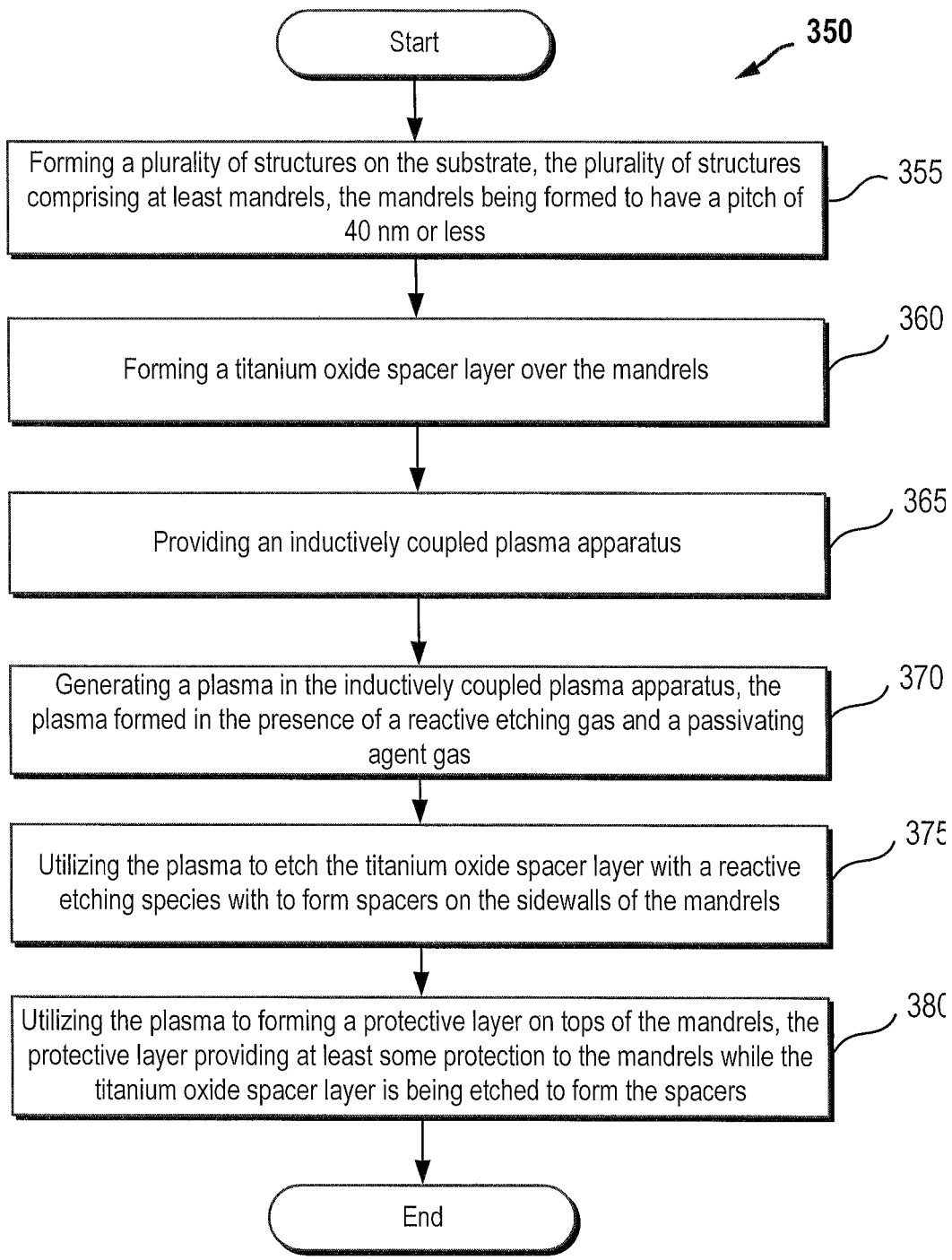

FIGS. 3A-3B illustrate exemplary methods for use of the processing techniques described herein. It will be recognized that the embodiments of FIGS. 3A-3B are merely exemplary and additional methods may utilize the techniques described herein. Further, additional processing steps may be added to the methods shown in the FIGS. 3A-3B as the steps described are not intended to be exclusive. Moreover, the order of the steps is not limited to the order shown in the figures as different orders may occur and/or various steps may be performed in combination or at the same time.

FIG. 3A illustrates one embodiment of a method 300 of forming spacers on a substrate for use in a self-aligned multiple patterning process. The method comprises step 305 of forming a plurality of structures on the substrate, the plurality of structures comprising at least mandrels, the mandrels being used as part of the SAMP process. The method further comprises step 310 of forming a spacer layer over the mandrels and step 315 of providing an inductively coupled plasma apparatus. The method also comprises step 320 of generating a one-step plasma in the inductively coupled plasma apparatus, the plasma formed in the presence of a reactive etching gas and a passivating agent gas. The method further comprises step 325 of utilizing the one-step plasma to etch the spacer layer with a reactive etching species to form spacers on the sidewalls of the mandrels. The method also comprises step 330 of utilizing the one-step plasma to form a protective layer on tops of the mandrels, the protective layer lessening the etch of the mandrels when the spacers are formed with the one-step plasma.

FIG. 3B illustrates one embodiment of a method 350 of forming titanium oxide spacers on a substrate. The method comprises step 355 of forming a plurality of structures on the substrate, the plurality of structures comprising at least mandrels, the mandrels being formed to have a pitch of 40 nm or less. The method further comprises step 360 of forming a titanium oxide spacer layer over the mandrels and step 365 of providing an inductively coupled plasma apparatus. The method also comprises step 370 of generating a plasma in the inductively coupled plasma apparatus, the plasma formed in the presence of a reactive etching gas and a passivating agent gas. The method further comprises step 375 of utilizing the plasma to etch the titanium oxide spacer layer with a reactive etching species to form spacers on the sidewalls of the mandrels. The method further comprises step 380 of utilizing the plasma to form a protective layer on tops of the mandrels, the protective layer providing at least some protection to the mandrels while the titanium oxide spacer layer is being etched to form the spacers.

Figure 4:
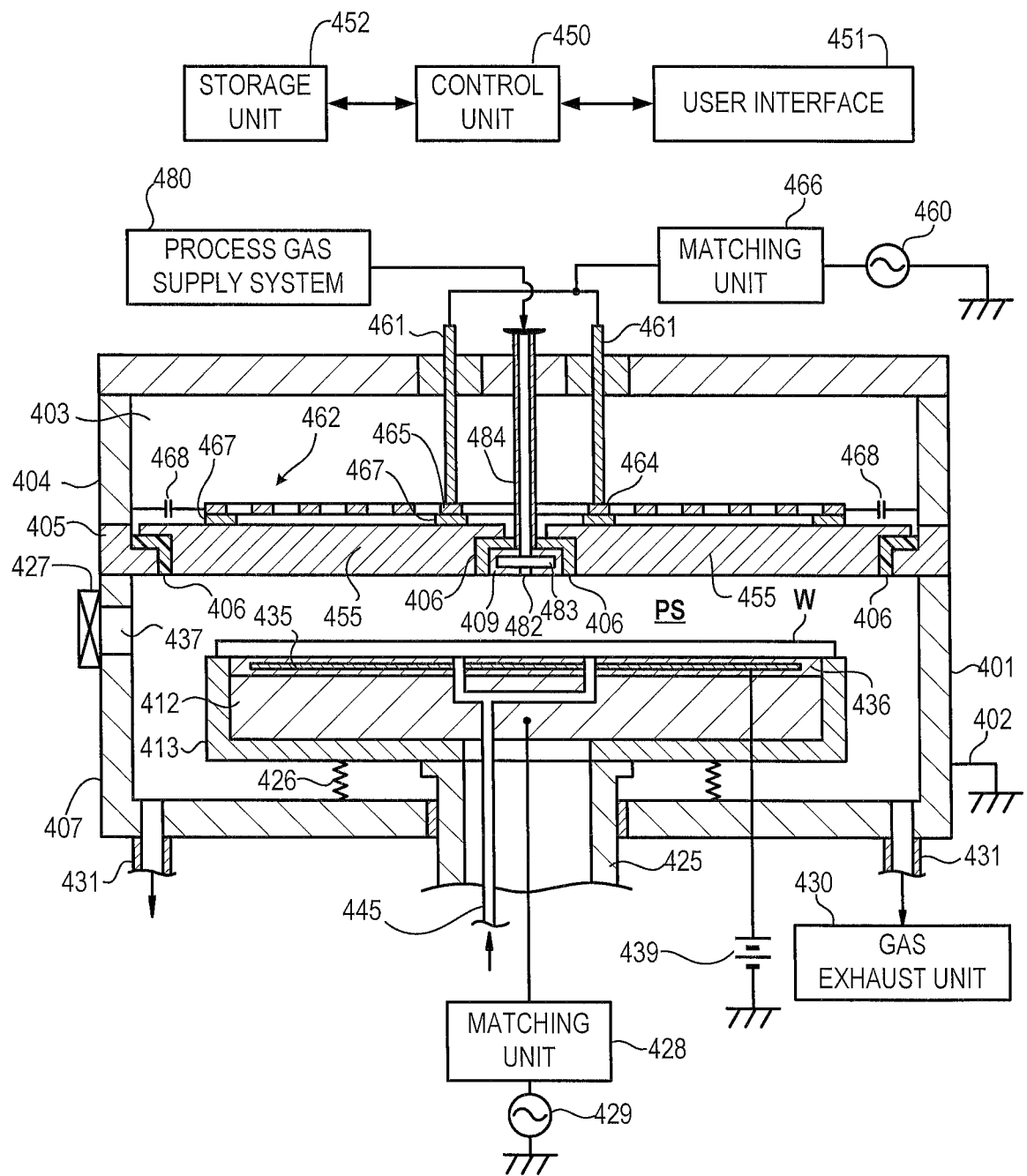
FIG. 4 illustrates an exemplary inductively coupled plasma system which may be utilized to perform the etch techniques described herein.

As mentioned above, one exemplary etch tool for use with the techniques described herein is an inductively coupled plasma apparatus. However, the techniques are not limited to an inductively coupled plasma and other etch apparatus may be utilized. FIG. 4 is a schematic cross-sectional view of an exemplary inductively coupled plasma processing apparatus that may be utilized with the techniques disclosed herein. It will be recognized that the apparatus of FIG. 4 is merely an exemplary inductively coupled plasma processing apparatus and a wide range of other inductively coupled plasma processing apparatus may be utilized. This apparatus can be used for multiple operations including ashing, etching, and deposition. Plasma processing can be executed within processing chamber 401, which can be a vacuum chamber made of a metal such as aluminum or stainless steel. The processing chamber 401 is grounded such as by ground wire 402.

The processing chamber 401 defines a processing vessel providing a process space PS for plasma generation. An inner wall of the processing vessel can be coated with alumina, yttria, or other protectant. The processing vessel can be cylindrical, square, column-shaped, etc.

At a lower, central area within the processing chamber 401, a susceptor 412 (which can be disc-shaped) can serve as a mounting table on which, for example, a substrate W to be processed (such as a semiconductor wafer) can be mounted. Substrate W can be moved into the processing chamber 401 through loading/unloading port 437 and gate valve 427. The susceptor 412 can be made of a conductive material. Susceptor 412 is provided thereon with an electrostatic chuck 436 for holding the substrate W. The electrostatic chuck 436 is provided with an electrode 435. Electrode 435 is electrically connected to DC power source 439 (direct current power source). The electrostatic chuck 436 attracts the substrate W thereto via an electrostatic force generated when DC voltage from the DC power source 439 is applied to the electrode 435 so that substrate W is securely mounted on the susceptor 412. The susceptor 412 can include an insulating frame 413 and be supported by support 425, which can include an elevation mechanism. The susceptor 412 can be vertically moved by the elevation mechanism during loading and/or unloading of the substrate W. A bellows 426 can be disposed between the insulating frame 413 and a bottom portion of the processing chamber 401 to surround support 425 as an airtight enclosure. Susceptor 412 can include a temperature sensor and a temperature control mechanism including a coolant flow path, a heating unit such as a ceramic heater or the like (all not shown) that can be used to control a temperature of the substrate W. A focus ring (not shown), can be provided on an upper surface of the susceptor 412 to surround the electrostatic chuck 436 and assist with directional ion bombardment.

A gas supply line 445, which passes through the susceptor 412, is configured to supply heat transfer gas to an upper surface of the electrostatic chuck 436. A heat transfer gas (also known as backside gas) such as helium (He) can be supplied between the substrate W and the electrostatic chuck 436 via the gas supply line 445 to assist in heating substrate W.

A gas exhaust unit 430 including a vacuum pump and the like can be connected to a bottom portion of the processing chamber 401 through gas exhaust line 431. The gas exhaust unit 430 can include a vacuum pump such as a turbo molecular pump configured to decompress the plasma processing space within the processing chamber 101 to a desired vacuum condition during a given plasma processing operation.

The plasma processing apparatus can be horizontally partitioned into an antenna chamber 403 and a processing chamber 401 by a window 455. Window 455 can be a dielectric material, such as quartz, or a conductive material, such as metal. Embodiments in which the window 455 is metal, the window 455 can be electrically insulated from processing chamber 401 such as with insulators 406. In this example, the window 455 forms a ceiling of the processing chamber 401. In some embodiments, window 455 can be divided into multiple sections, with these sections optionally insulated from each other.

Provided between sidewall 404 of the antenna chamber 403 and sidewall 407 of the processing chamber 401 is a support shelf 405 projecting toward the inside of the processing apparatus. A support member 409 serves to support window 455 and also functions as a shower housing for supplying a processing gas. When the support member 409 serves as the shower housing, a gas channel 483, extending in a direction parallel to a working surface of a substrate W to be processed, is formed inside the support member 409 and communicates with gas injection openings 482 for injecting process gas into the process space PS. A gas supply line 484 is configured to be in communication with the gas channel 483. The gas supply line 484 defines a flow path through the ceiling of the processing chamber 401, and is connected to a process gas supply system 480 including a processing gas supply source, a valve system and the corresponding components. Accordingly, during plasma processing, a given process gas can be injected into the process space PS.

In antenna chamber 403, a high-frequency antenna 462 (radio frequency) is disposed above the window 455 so as to face the window 455, and can be spaced apart from the window 455 by a spacer 467 made of an insulating material. High-frequency antenna 462 can be formed in a spiral shape or formed in other configurations.

During plasma processing, a high frequency power having a frequency of, e.g., 13.56 MHz, for generating an inductive electric field can be supplied from a high-frequency power source 460 to the high-frequency antenna 462 via power feed members 461. A matching unit 466 (impedance matching unit) can be connected to high-frequency power source 460. The high-frequency antenna 462 in this example can have corresponding power feed portion 464 and power feed portion 465 connected to the power feed members 461, as well as additional power feed portions depending on a particular antenna configuration. Power feed portions can be arranged at similar diametrical distances and angular spacing. Antenna lines can extend outwardly from power feed portion 464 and power feed portion 465 (or inwardly depending on antenna configuration) to an end portion of antenna lines. End portions of antenna lines are connected to the capacitors 468, and the antenna lines are grounded via the capacitors 468. Capacitors 468 can include one or more variable capacitors.

With a given substrate mounted within processing chamber 401, one or more plasma processing operations can be executed. By applying high frequency power to the high-frequency antenna 462, an inductive electric field is generated in the processing chamber 401, and processing gas supplied from the gas injection openings 182 is turned into a plasma by the inductive electric field. The plasma can then be used to process a given substrate such as by etching, ashing, deposition, etc.

High-frequency power source 429 (as second high-frequency power source) is connected to the susceptor 412 via a matching unit 428. The high-frequency power source 429 supplies a high frequency bias power having a frequency of, e.g., 3.2 MHz (or other frequency), to the mounting table during plasma processing. Applying high frequency bias power causes ions, in plasma generated in the processing chamber, to be attracted to substrate W.

Components of the plasma processing apparatus can be connected to, and controlled by, a control unit 450, which in turn can be connected to a corresponding storage unit 452 and user interface 451. Various plasma processing operations can be executed via the user interface 451, and various plasma processing recipes and operations can be stored in storage unit 452. Accordingly, a given substrate can be processed within the plasma processing chamber with various microfabrication techniques.

The techniques for providing a one-step etching process of a $TiO_2$ spacer described herein may be accomplished with a variety of etch process conditions (power, pressure, temperature, gasses, flow rates, etc.). An exemplary process recipe is described herein for use with an inductively coupled plasma processing apparatus; however other process tools, process conditions and variables may be utilized. In one embodiment, an inductively coupled plasma etch may utilize a single step etch process having a source power (high frequency) in a range of 100-300 W, a bias power (low frequency) in a range of 100-250 W, a pressure in a range of 10-15 mTorr, and a temperature in a range of 40-70 degrees Celsius. Gasses utilized may include argon (Ar) in a range of 100-250 standard cubic centimeters per minute (sccm), chlorine ($Cl_2$) in a range of 70-90 sccm (the reactive etching species), carbon tetrafluoride ($CF_4$) or nitrogen trifluoride ($NF_3$) and methane ($CH_4$) in a range of 10-40 sccm (the passivation agent). The use of such an etch process provides a one-step etch that achieves a highly anisotropic profile, has bottom separation of the spacer structures, and selectively forms a protective layer on the mandrel top and the spacer top. As described above, the formation of the protective layer allows for etching of the spacer layer to leave sidewall spacers on the mandrels without sidewall loss and damage to the mandrel when etching the spacer material long enough to provide for bottom separation of adjacent spacer structures. These techniques are particularly useful when using mandrels that have line pitches of 40 nm or less.

Figure 5:
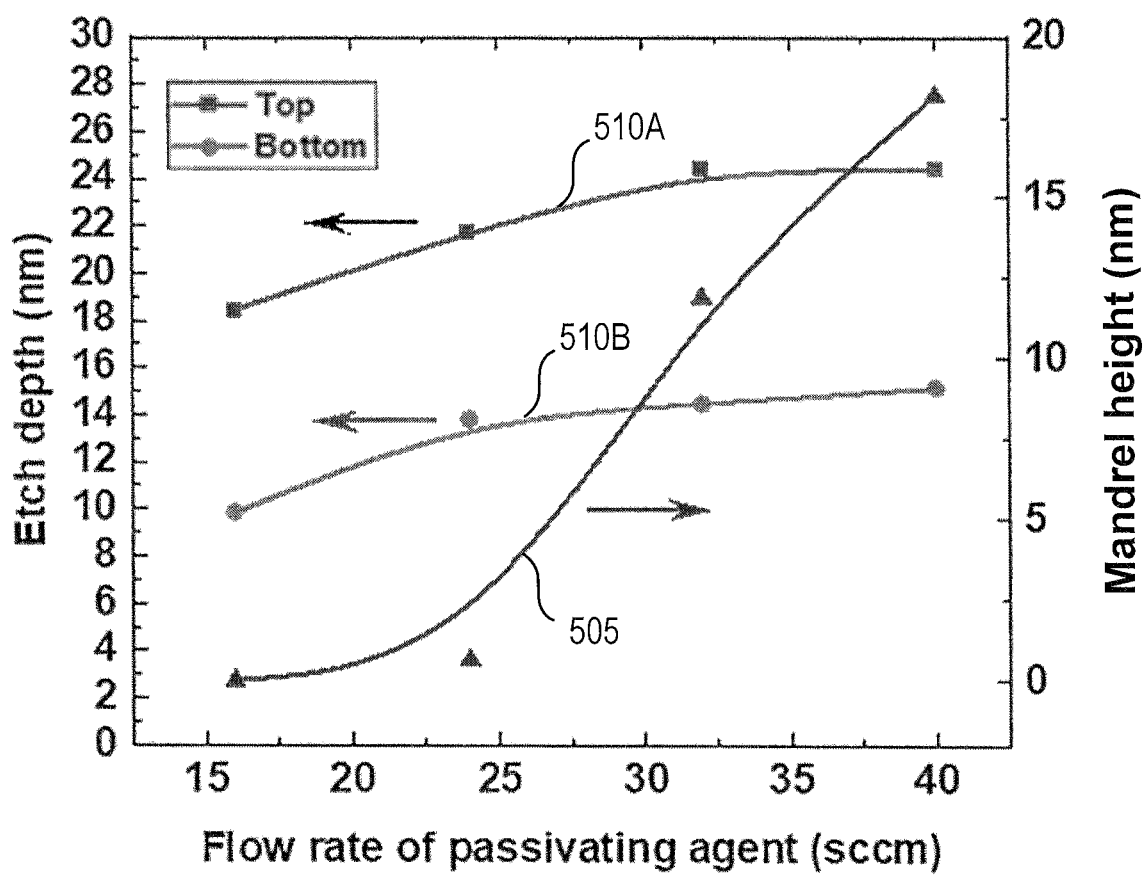
FIG. 5 illustrates experimental results for an etch according to the techniques described herein for varying passivation agent flow rates.

FIG. 5 illustrates exemplary experimental data utilizing an inductively coupled plasma process as described above to etch a $TiO_2$ spacer formed on an amorphous silicon mandrel. In the example utilized, 36 nm pitch mandrels having a starting height of 35-45 nm are utilized along with spacer deposition height of 7-9 nm. More particularly, FIG. 5 illustrates the impact of varying the flow rate of the passivation agent, in this case $CH_4$. As shown in FIG. 5, flow rates of the passivation agent were changed from 15 sccm to 40 sccm. Plot 505 illustrates the mandrel height after etch at differing flow rates for the passivating agent. As shown by plot 505, the mandrel height after etch may vary significantly depending upon the passivating agent flow rate. More particularly, the higher flow rates of a passivating agent provide increased protection to the mandrel during the etch leaving significantly more of the mandrel after the etch. As seen in the graph, the mandrel height post etch may range from almost 0 nm to almost 20 nm depending upon the passivating agent flow rate. While the passivating agent flow rate dramatically changes the etching of the mandrel, the passivating agent has less of impact on the etch rate of the $TiO_2$ at the top of the spacer and at the bottom of the spacer. More particularly, plot 510A illustrates the change in etch depth of the spacer at the top of the spacer: ranging from about 18 nm to 22 nm. Furthermore, plot 510B illustrates the change in etch depth of the spacer at the bottom of the spacer: ranging from about 10 nm to 14 nm.

The differing impact on the mandrel versus the spacer seen in FIG. 5 may be the result of various mechanisms such as for example, but not limited to, a chemically driven reaction between the mandrel material and the passivating agent and/or enhanced polymerization on the mandrel as a result of the increased passivation agent flow rate. Other mechanisms may also occur and the techniques described herein are not limited to a particular mechanism.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of forming spacers on a substrate for use in a self-aligned multiple patterning process (SAMP), the method comprising:
   forming a plurality of structures on the substrate, the plurality of structures comprising at least mandrels, the mandrels being used as part of the SAMP process;
   forming a spacer layer over the mandrels;
   providing an inductively coupled plasma apparatus;
   generating a one-step plasma in the inductively coupled plasma apparatus, the one-step plasma formed in a presence of a reactive etching gas and a passivating agent gas;
   utilizing the one-step plasma to etch the spacer layer with a reactive etching species with to form the spacers on sidewalls of the mandrels; and
   utilizing the one-step plasma to forming a protective layer on tops of the mandrels, the protective layer lessening the etch of the mandrels when the spacers are formed with the one-step plasma.

2. The method of claim 1, wherein the spacer layer comprises titanium oxide.

3. The method of claim 1, wherein the mandrels comprise amorphous silicon.

4. The method of claim 3, wherein the spacer layer comprises titanium oxide.

5. The method of claim 4, wherein the reactive etching gas comprises chlorine.

6. The method of claim 4, wherein the passivating agent gas comprises methane.

7. The method of claim 6, wherein the reactive etching gas comprises chlorine.

8. The method of claim 7, wherein the one-step plasma is formed in a presence of carbon tetrafluoride ($CF_4$) and/or nitrogen trifluoride.

9. The method of 1, wherein the mandrels have a pitch of 40 nm or less.

10. A method of forming titanium oxide spacers on a substrate, the method comprising:
    forming a plurality of structures on the substrate, the plurality of structures comprising at least mandrels, the mandrels being formed to have a pitch of 40 nm or less;
    forming a titanium oxide spacer layer over the mandrels;
    providing an inductively coupled plasma apparatus;
    generating a plasma in the inductively coupled plasma apparatus, the plasma formed in a presence of a reactive etching gas and a passivating agent gas;
    utilizing the plasma to etch the titanium oxide spacer layer with a reactive etching species with to form the titanium oxide spacers on sidewalls of the mandrels; and
    utilizing the plasma to forming a protective layer on tops of the mandrels, the protective layer providing at least some protection to the mandrels while the titanium oxide spacer layer is being etched to form the spacers.

11. The method of claim 10, wherein the mandrels comprise amorphous silicon.

12. The method of claim 11, wherein the reactive etching gas comprises chlorine.

13. The method of claim 11, wherein the passivating agent gas comprises methane.

14. The method of claim 13, wherein the reactive etching gas comprises chlorine.

15. The method of claim 10, wherein the reactive etching gas comprises chlorine.

16. The method of claim 10, wherein the passivating agent gas comprises methane.

17. The method of claim 16, wherein the reactive etching gas comprises chlorine.

18. The method of claim 17, wherein the plasma is formed in a presence of carbon tetrafluoride ($CF_4$) and/or nitrogen trifluoride.

19. The method of claim 10, wherein the mandrels are utilized as part of a self-aligned multiple patterning process.

20. The method of claim 19, wherein the mandrels comprise amorphous silicon.

* * * * *